United States Patent
Mellot

(10) Patent No.: US 10,712,198 B2
(45) Date of Patent: Jul. 14, 2020

(54) MEASURING PROCESS OF THE AVERAGE FREQUENCY OF AN ALTERNATING SIGNAL, AND CORRESPONDING ELECTRONIC CIRCUIT

(71) Applicant: STMicroelectronics (Grenoble 2) SAS, Grenoble (FR)

(72) Inventor: Pascal Mellot, Lans en Vercors (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 133 days.

(21) Appl. No.: 16/110,779

(22) Filed: Aug. 23, 2018

(65) Prior Publication Data

US 2019/0170573 A1     Jun. 6, 2019

(30) Foreign Application Priority Data

Dec. 4, 2017 (FR) ...................... 17 61583

(51) Int. Cl.
*G01J 1/42* (2006.01)
*G01R 23/10* (2006.01)
*G01J 1/44* (2006.01)

(52) U.S. Cl.
CPC .............. *G01J 1/44* (2013.01); *G01J 1/4204* (2013.01); *G01R 23/10* (2013.01)

(58) Field of Classification Search
CPC ................................ G01J 1/4204; G01R 23/10
See application file for complete search history.

(56) References Cited

U.S. PATENT DOCUMENTS

| 4,350,950 A | 9/1982 | Waldmann et al. |
| 2009/0084943 A1* | 4/2009 | Solhusvik ................ G01J 1/02 250/214 AL |
| 2014/0117214 A1 | 5/2014 | Mellot |
| 2014/0286472 A1 | 9/2014 | Iwasa |

FOREIGN PATENT DOCUMENTS

| DE | 10127428 A1 | 12/2002 |
| EP | 0263745 A1 | 4/1988 |
| FR | 2458077 A1 | 12/1980 |
| FR | 2992418 A1 | 12/2013 |
| FR | 2997496 A1 | 5/2014 |
| RU | 2308041 C1 | 10/2007 |

* cited by examiner

Primary Examiner — Thanh Luu
(74) Attorney, Agent, or Firm — Slater Matsil, LLP

(57) ABSTRACT

In an embodiment, a method for measuring an average frequency of an AC signal includes receiving the AC signal, triggering a first counter that is clocked at a first frequency, detecting each zero crossing of the AC signal in a predetermined crossing direction, recording a value of the first counter at each detected zero crossing, incrementing a second counter at each detected zero crossing, and calculating the average frequency of the AC signal based on the first frequency, a last recorded value of the first counter, and a last value of the second counter.

23 Claims, 6 Drawing Sheets

MEASURING PROCESS OF THE AVERAGE FREQUENCY OF AN ALTERNATING SIGNAL, AND CORRESPONDING ELECTRONIC CIRCUIT

CROSS-REFERENCE TO RELATED APPLICATIONS

This application claims priority to French Patent Application No. 1761583, filed on Dec. 4, 2017, which application is hereby incorporated herein by reference.

TECHNICAL FIELD

The present invention relates generally to an electronic system and method, and, in particular embodiments, to a measuring process of the average frequency of an alternating signal, and corresponding electronic circuit.

BACKGROUND

A conventional ambient light sensor (ALS) generally comprises at least one photodiode. The decrease in the voltage across the terminals of each photodiode is dependent on the amount of light received by this photodiode.

It is generally possible to deduce an ambient light level by measuring the voltage across the terminals of each photodiode at the end of an integration period before and after which the sensor is reset through recharging of the corresponding photodiode.

However, such a light level detection is generally sensitive to the flicker of artificial light sources that are powered with alternating current (AC) and that illuminate the photodiode.

Such flicker may in particular negatively affect the results of the ambient light level detection, for example through the appearance of moiré patterns on images taken by an image-capturing device coupled to the sensor.

In a case where the artificial light sources are powered by the mains voltage at 50 Hz/60 Hz, one solution for solving this flicker problem consists in choosing an integration period for the photodiode that is a multiple of the half-period of the mains voltage. That is to say a multiple of 10 ms for an AC voltage at 50 Hz or a multiple of 8.33 ms for an AC voltage at 60 Hz. Such a solution is described in French patent document FR 2 997 496 and corresponding U.S. patent publication US20140117214.

In recent years, the widespread use of artificial light sources based in particular on light-emitting diode (LED) technology and on energy-saving lights has led to flicker sources that are based on AC frequencies other than the conventional frequencies, i.e. 50 Hz or 60 Hz.

In addition, a conventional ambient light sensor is generally designed to generate only DC output signals that do not, unfortunately, contain information relating to the random frequency or frequencies of the flicker sources.

Once AC output signals corresponding to the variation of the ambient light level in the proximity of each photodiode of an ambient light sensor have been obtained, as is conventional, it is then necessary to provide a complex signal processing operation of fast Fourier transform (FFT) type to the output signals.

There is thus a need to propose a technical solution with low complexity and a small silicon footprint that makes it possible to generate AC output signals corresponding to the variation of the ambient light level in the proximity of each photodiode of an ambient light sensor.

These AC output signals are intended to be delivered to what is termed a host processor, for example a microcontroller, that is able to calculate flicker frequencies of the light sources on the basis of these AC output signals by using for example a complex signal processing operation of fast Fourier transform (FFT) type.

However, such a complex signal processing operation generally requires a high computing power and a significant computing time, these not being desirable in the context of the overall performance of the sensor and in particular in the context of user experience.

Furthermore, although such a complex signal processing operation may make it possible to obtain a plurality of different flicker frequencies of the light sources, it is only possible to use an average flicker frequency as a basis for choosing an exposure time that is tailored in such a way as to attenuate or even to prevent such a flicker problem at variable frequencies.

In other words, it is not really necessary to obtain all of the different flicker frequencies of the light sources in order to improve the performance of the ambient light sensor.

In this respect, there is therefore a need to propose a low-complexity and inexpensive technical solution that makes it possible, quickly and accurately, to obtain the average flicker frequency of the light sources on the basis of the AC output signals.

More generally, there is a need to propose a technically simple solution for determining the average frequency of an AC signal.

SUMMARY

Modes of implementation and embodiments of the invention relate to electronic circuits, in particular electronic circuits for at least measuring the average frequency of an AC signal originating particularly, but without limitation, from light level sensors, in particular ALS that can be incorporated into devices such as mobile telephones, tablets or portable computers.

According to one aspect, what is proposed is a method for measuring at least the average frequency of an AC signal.

In this method, the AC signal is received during a measuring period. A first counter, clocked at a first frequency higher than the maximum possible frequency of the AC signal, is triggered. Starting from the beginning of the measuring period, each zero crossing of the AC signal in a predetermined crossing direction, for example from positive values to negative values, is detected. The current value of the first counter is recorded at each zero crossing of the AC signal in the crossing direction. At the first zero crossing of the AC signal in the crossing direction, a second counter with an initial counter value is triggered. The second counter is incremented at each subsequent zero crossing of the AC signal in the crossing direction. At the end of the measuring period, the duration of a portion of the AC signal to be taken into account is calculated on the basis of the first frequency and of the first and last recorded current values of the first counter. The average frequency of the AC signal is calculated on the basis of the duration, the initial counter value and the last value the second counter.

Advantageously, the first counter in this case operates as an internal clock for the measurement of the average frequency of the AC signal. The period of the interval between two successive updates of the first counter, which period is equal to the reciprocal of the first frequency, is used as a reference time unit.

To this end, the first frequency is chosen to be higher than the maximum possible frequency of the AC signal so as to ensure accuracy of the measurement.

Upon the first zero crossing of the AC signal in the crossing direction from the beginning of the measuring period, the current value of the first counter is recorded, for example, in an internal register so as to store it in memory as the initial value of the first counter, and the second counter is configured to be triggered with an initial value, for example at zero.

Next, at each subsequent zero crossing of the AC signal in the crossing direction, the current value of the first counter is recorded and the second counter is incremented.

Specifically, the value of the second counter is used to record the number of periods of the AC signal to be taken into account for the measurement of its average frequency, and the recorded current value of the first counter is used with the initial value of the first counter to record the number of update intervals of the first counter during the number of periods of the AC signal to be taken into account.

Advantageously, the duration of the periods of the AC signal to be taken into account is able to be calculated on the basis of the period of the interval and of the number of intervals.

It is hence possible to calculate the average frequency of the AC signal by dividing the number of periods of the AC signal to be taken into account by the duration of the periods of the AC signal to be taken into account.

As the current value of the first counter is recorded and the second counter is incremented only each time the AC signal crosses zero in the crossing direction, the accuracy of the measurement of the average frequency is always able to be ensured, even if the measuring period does not end at the instant of a zero crossing of the AC signal in the crossing direction.

According to one mode of implementation, the first and second counters have a first maximum value and a second maximum value, respectively.

The incrementing of the second counter is stopped when the current value of the first counter reaches the first maximum value.

The recording of the current value of the first counter is stopped when the value of the second counter reaches the second maximum value.

Such a use of the first and second maximum values for the first and second counters advantageously enables an operation of automatically stopping the measurement in order to avoid any measurement errors when the average frequency is too high or too low.

By way of a non-limiting example, as indicated above, the predetermined crossing direction may correspond to a zero crossing of the AC signal from its positive values.

According to another mode of implementation, the method may comprise, during the measuring period, determination of the average amplitude of the AC signal. This determination includes, for example, successive measurements of positive peak values of the AC signal when the control signal is in the first state, successive measurements of negative peak values of the AC signal when the control signal is in the first state, and successive comparisons between the measured positive peak values and the absolute values of the measured negative peak values so as to deliver an amplitude signal the amplitude of which corresponds to the average amplitude of the AC signal. The amplitude of the amplitude signal correspond to the minimum values between the measured positive peak values and the absolute values of the measured negative peak values.

Advantageously, these steps of the method enable measurement of the amplitude signal corresponding to the average amplitude of the AC signal that has converged and stabilized over time.

By way of non-limiting indication, the measuring period is adjustable.

Such an adjustable measuring period advantageously enables control over the beginning, the duration and the end of a measurement of the average frequency of the AC signal via the control signal, for example.

As a long measurement of the average frequency of the AC signal may generally attenuate the temporal evolution of the AC signal in the frequency domain, it is therefore possible to adjust the measuring period in order to obtain a better performance.

According to yet another mode of implementation, the AC signal is a digital AC signal representative of the level of ambient light radiation. This AC signal is obtained through the following steps: resetting and triggering a third counter each time at least one photodiode illuminated by the ambient light radiation reaches a discharge threshold, the third counter then being clocked by a clock signal having a second frequency and delivering a third counter output signal; generating an intermediate signal, involving clipping and inversion of the third counter output signal; undersampling the intermediate signal at a third frequency lower than the second frequency; and bandpass-filtering the sampled intermediate signal so as to generate the AC signal.

The bandpass filtering has an upper cutoff frequency that determines the maximum frequency of the AC signal.

It is hence easily possible to choose a first frequency that is higher than the upper cutoff frequency so as to ensure the performance of the method for measuring the average frequency of the AC signal.

Furthermore, such a method advantageously makes it possible to generate the AC signal while remaining compatible with the circuit disclosed in document FR 2 997 496, which circuit is configured to generate a DC output signal.

An image-capturing device may, for example, use the measured average amplitude and the measured average frequency of the AC signal to prevent any problems linked to the flicker of the ambient light radiation.

Such clipping advantageously makes it possible to eliminate periods in which the light level is too low, and the amplitude of the generated intermediate signal is advantageously proportional to the light level detected at the end of the inversion.

It should be noted that the trigger frequency of the counter is variable, and depends on the ambient light radiation received by the at least one photodiode.

It is thus desirable to perform such undersampling at the known and if possible constant second frequency so as to enable optional digital filtering on the intermediate signal.

Advantageously, such undersampling also makes it possible to reduce the computational power required for subsequent processing operations, while at the same time keeping satisfactory accuracy and design flexibility.

Advantageously, such bandpass filtering makes it possible to filter out flicker frequencies that are uncommon in everyday life so as to further improve the performance of the method.

It should be noted that the first frequency is therefore higher than the upper cutoff frequency, namely for example of the order of 2 KHz, of the bandpass filtering.

According to another aspect, an electronic circuit is proposed. This circuit comprises a first counter clocked at a first frequency, a second counter, and a control circuit intended to receive, during a measuring period, an AC signal the maximum possible frequency of which is lower than the first frequency. The control circuit is configured to trigger the first counter, detect, starting from the beginning of the measuring period, each zero crossing of the AC signal in a predetermined crossing direction, record the current value of the first counter at each zero crossing of the AC signal in the crossing direction, and trigger, at the first zero crossing of the AC signal in the crossing direction, a second counter with an initial counter value. A calculating module configured to calculate, at the end of the measuring period, the duration of a portion of the AC signal to be taken into account on the basis of the first frequency and of the first and last recorded current values of the first counter, and to calculate the average frequency of the AC signal on the basis of the duration, the initial counter value, and the last value of the second counter.

According to one embodiment, the first and second counters have a first maximum value and a second maximum value, respectively, the control circuit is configured to stop incrementing the second counter when the current value of the first counter reaches the first maximum value, and the control circuit is configured to stop the recording of the current value of the first counter when the value of the second counter reaches the second maximum value.

By way of non-limiting indication, the predetermined crossing direction may, for example, correspond to a zero crossing of the AC signal from its positive values.

According to another embodiment, the circuit furthermore comprises a determination module for determining the average amplitude of the AC signal. The determination module includes a first measuring circuit configured to successively measure positive peak values of the AC signal, a second measuring circuit configured to successively measure negative peak values of the AC signal, and a comparison circuit configured to successively compare the measured positive peak values and the absolute values of the measured negative peak values and to deliver an amplitude signal the amplitude of which corresponds to the average amplitude of the AC signal, the amplitude of the amplitude signal corresponding to the minimum values between the measured positive peak values and the absolute values of the measured negative peak values.

The first and second measuring circuits may be implemented in any way known in the art. For example, the first and second measurement circuits may be implemented using analog-to-digital converters (ADCs), in combination with digital processing, which may be performed with a controller, digital signal processor (DSP), general purpose processor, or any other circuit. Analog measurement circuits, such as using analog amplifiers, peak detectors, and other circuits, may also be used.

The comparison circuit may be implemented using comparators as well as performing the comparison using a controller, for example. In some embodiments, comparators included in the controller are used to perform the comparison. Other implementations are also possible.

The measuring period may, for example, be adjustable.

According to yet another embodiment, the AC signal is representative of the level of ambient light radiation, and the circuit further comprises at least one photodiode, a third counter configured to be clocked by a clock signal having a second frequency so as to deliver a third counter output signal, a control module configured to reset and trigger the third counter when the at least one photodiode illuminated by ambient light radiation reaches a discharge threshold, and a processing stage including a processing module configured to generate an intermediate signal through clipping and inversion of the counter output signal, a sampling module configured to undersample the intermediate signal at a second frequency lower than the first frequency, and a filtering module configured to perform bandpass filtering of the sampled intermediate signal so as to generate the AC signal.

The bandpass filtering has an upper cutoff frequency that determines the maximum frequency of the AC signal.

Advantageously, this electronic circuit is compatible with the circuit disclosed in document FR 2 997 496, which circuit is configured to generate a DC output signal.

In other words, it is possible simultaneously to generate an AC output signal and a DC output signal without using two completely separate circuits, thereby advantageously reducing the silicon footprint.

According to another aspect, what is proposed is an ambient light sensor, comprising at least one circuit such as described above.

According to another aspect, what is proposed is an electronic appliance, such as a cellular mobile telephone, tablet or laptop computer, comprising at least one sensor such as described above.

According to yet another aspect, what is proposed is a motor vehicle, comprising at least one sensor such as described above.

BRIEF DESCRIPTION OF THE DRAWINGS

Other advantages and features of the invention will become apparent on examining the detailed description of wholly non-limiting modes of implementation and embodiments and the appended drawings, in which.

DETAILED DESCRIPTION OF ILLUSTRATIVE EMBODIMENTS

Figure 1:
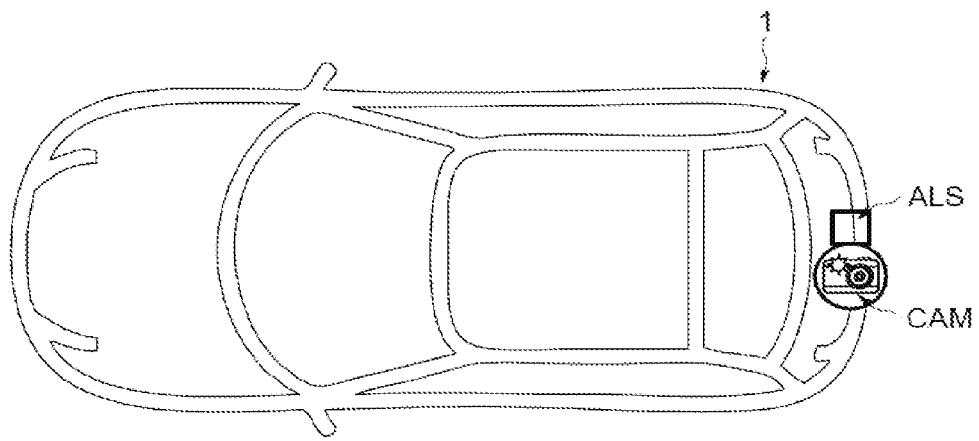
FIGS. 1 to 10 schematically illustrate modes of implementation and embodiments of the invention.

The reference 1 in FIG. 1 illustrates a motor vehicle, in this case, for example, a car 1, equipped with at least one ambient light sensor, in this case, for example, a sensor ALS positioned at the rear of the car and in the proximity of a reverse camera system CAM of the car 1.

The ambient light sensor ALS is configured to measure the light level in the proximity of the sensor ALS and to deliver, to the reverse camera system CAM, one or more signals representative of the flicker frequency or frequencies of artificial light sources SLA in the proximity of the car 1.

It should be noted that the artificial light sources SLA based on LED ("Light-Emitting Diode") technology, for example LED rear lights and headlights for cars, have become widely used in everyday life in recent years.

As a result, the flicker frequency or frequencies of the artificial light sources SLA are no longer limited to conventional frequencies, i.e., 50 Hz and 600 Hz. By way of indication, the flicker frequencies may vary between a few Hz and 2 kHz.

Figure 2:
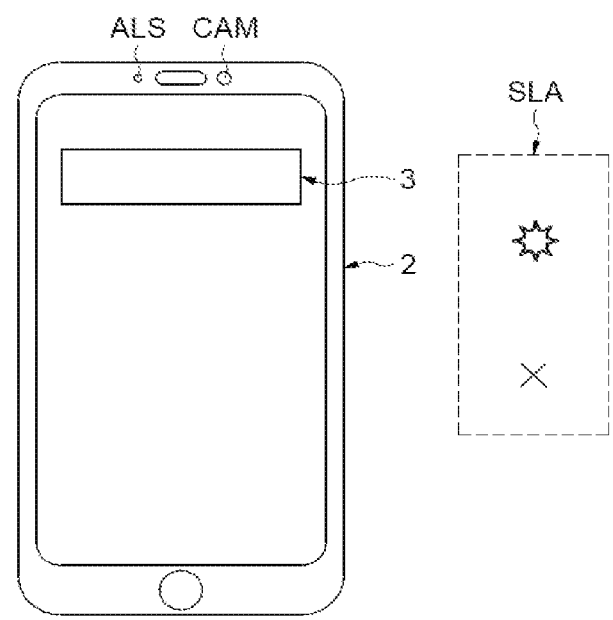

FIG. 2 illustrates, highly schematically, a plurality of artificial light sources SLA and an electronic appliance 2, in this case for example a smartphone 2, including an ambient light sensor ALS positioned in the proximity of a camera module CAM, in this case for example a frontal camera module CAM, and a processing unit 3, in this case for example an image processor 3.

The ambient light sensor ALS is configured to deliver, to the image processor 3, the average amplitude and the average frequency of at least one AC output signal so as to enable the processor 3 to choose an exposure time tailored to the frontal camera module CAM, thereby possibly helping to make the camera module CAM less sensitive to the flicker frequency or frequencies of the artificial light sources SLA and to therefore increase the quality of images taken by the camera module CAM.

Figure 3:
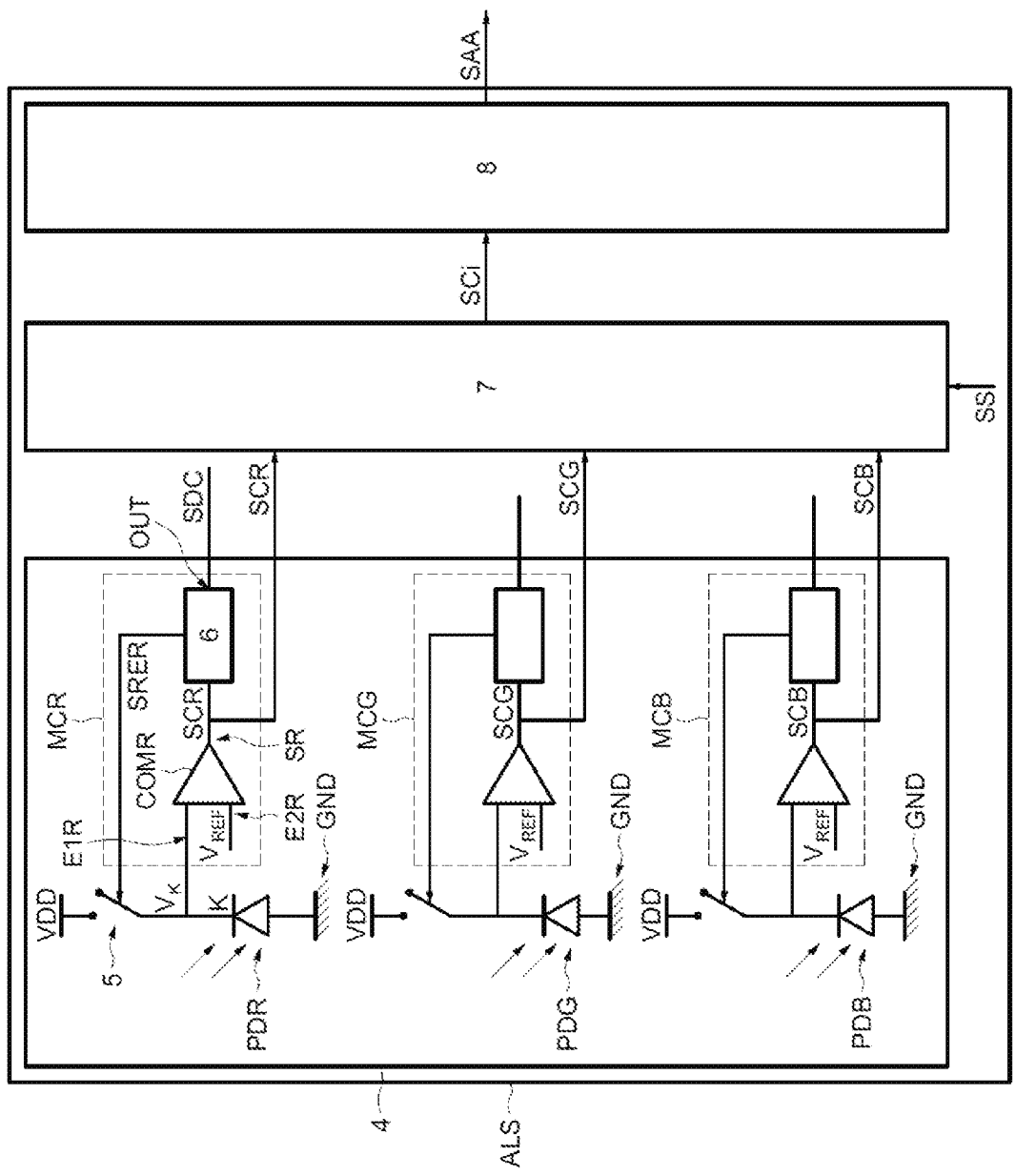

Reference is now made to FIG. 3 in order to schematically illustrate an exemplary implementation of the ambient light sensor ALS.

The sensor ALS comprises a first circuit 4 including at least one photodiode, in this case for example three photodiodes PDR, PDG and PDB, each intended to receive lights of a distinct color (e.g., red R, green G, blue B) and linked to a corresponding control module MCR, MCG and MCB.

By way of example, the first circuit 4 may also include other photodiodes that are intended to receive, for example, infrared radiation having a wavelength of greater than 850 nm.

As the structures of each photodiode PDR, PDG or PDB and its corresponding control module MCR, MCG or MCB are identical, for the sake of simplicity, the simplified circuit diagram of the photodiode PDR and of its corresponding control module MCR will be focused on.

The anode of the photodiode PDR is coupled to ground GND, and the cathode K of the photodiode PDR is coupled to a positive power supply terminal VDD of the first circuit 4 via a reset switch 5, in this case for example formed by an MOS transistor.

The control module MCR comprises a comparator COMR having a first input E1R coupled to the cathode K of the photodiode PDR, a second input E2R coupled to a reference voltage VREF and an output SR, and a control stage 6 coupled to the output SR and to the switch 5.

The comparator COMR is known per se to those skilled in the art and configured to deliver a comparison signal SCR to the output SR on the basis of the voltages present on the first input E1R and the second input E2R.

Figure 4:
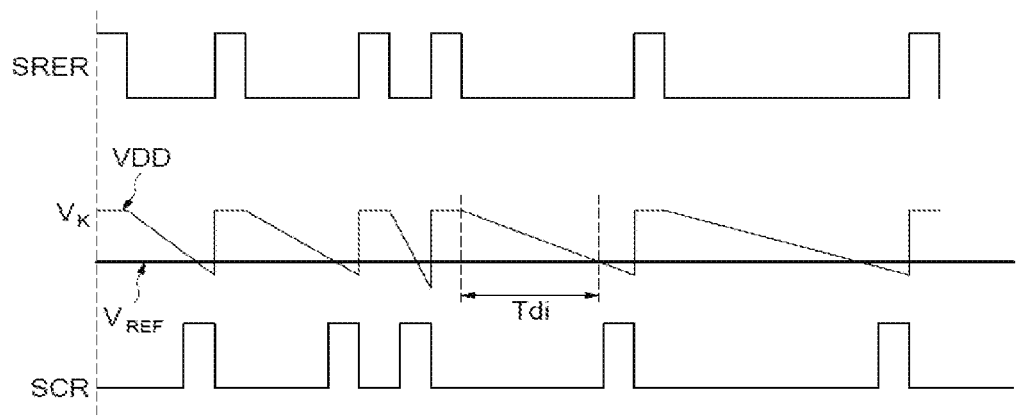

FIG. 4 shows a timing diagram to illustrate the operation of the photodiode PDR and of the corresponding control module MCR.

When the voltage present on the first input E1R, in other words the voltage VK on the cathode of the photodiode PDR, is greater than the reference voltage VREF, the comparison signal SCR is in a first state, in this case for example a low state.

When the voltage VK is lower than the reference voltage VREF, the comparison signal SCR is in a second state, in this case for example a high state.

The reference voltage VREF functions in this case as a discharge threshold that is able to be used to regulate the discharge time Tdi of the photodiode PDR. It should be noted that, in order to detect a frequency of 2 kHz, the discharge time Tdi must not exceed $1/(2*2\,k)$ μs, i.e., 250 μs.

The control stage 6 is intended to receive the comparison signal SCR and configured to deliver, to the switch 5, a reset signal SRER on the basis of the comparison signal SCR so as to control the recharging of the photodiode PDR.

When the reset signal SRER is in the low state, the switch 5 is open, and therefore the cathode K of the photodiode PDR is not coupled to the positive power supply terminal VDD.

As the photodiode PDR is sensitive to light, the voltage VK decreases at a rate that depends on the light intensity received by the photodiode PDR.

When the comparison signal SCR is in its high state, the control stage 6 is configured to deliver the reset signal SRER in its high state so as to put the switch 5 into the closed state.

The cathode K of the photodiode PDR is hence linked once again to the positive power supply terminal VDD. The voltage VK is substantially equal to the voltage on the power supply terminal VDD, which voltage is greater than the reference voltage VREF. The comparison signal SCR is once again in the low state.

The control stage 6 in this case furthermore comprises an output OUT, and is configured to supply a value representative of a light level measured by the sensor ALS. This representative value is in this case generated in the form of a DC signal SDC.

The detailed operation and the detailed structure of the control stage 6 may be found in document FR 2 997 496, which is incorporated herein by reference in its entirety.

As will now be seen in greater detail, the sensor ALS is also configured to supply a value representative of a light level in the form of an AC signal. To this end, the sensor ALS furthermore comprises a selection module 7 intended to receive all of the comparison signals SCR, SCG and SCB of the photodiodes PDR, PDG and PDB and configured to selectively supply one of the comparison signals SCR, SCG and SCB on the basis of a selection signal SS; and a second circuit 8 intended to receive the comparison signal SCi, i=R, G or B, selected and configured to generate an AC signal SAA representative of the light level and of frequencies of the ambient light radiation illuminating the sensor ALS.

By way of example, the selection module 7 may comprise a conventional multiplexer that is known per se to those skilled in the art.

Figure 5:
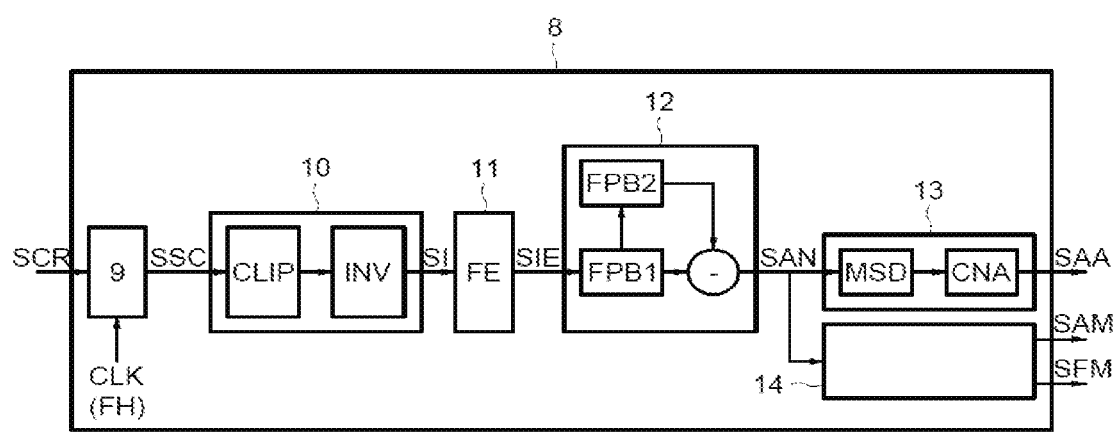

Reference is now made to FIG. 5 in order to illustrate an exemplary implementation of the second circuit 8.

The second circuit 8 includes: a preliminary counter 9 intended to receive the comparison signal selected by the multiplexer, in this case for example the comparison signal SCR, and configured to be reset when the corresponding photodiode, in this case, for example, the photodiode PDR, reaches its discharge threshold.

Once it has been reset and triggered, the preliminary counter 9 is then clocked by a clock signal CLK having a clock frequency FH, in this case, for example, at 10 MHz, and configured to deliver a preliminary counter output signal SSC.

As an alternative solution, the second circuit 8 may also include a processing stage ET including a conversion module 13 configured to perform a digital-to-analog conversion of a digital AC signal SAN taken from the preliminary counter output signal SSC so as to deliver an analog AC signal SAA representative of the level and of the frequency or frequencies of the ambient light radiation to what is termed a host processor of the sensor ALS, for example a microcontroller, that is able to perform signal processing operations such as a fast Fourier transform and a pulse width modulation ("PWM") so as to extract information relating to the flicker levels and flicker frequency or frequencies of the ambient light radiation on the basis of the AC signal SAA.

As indicated above, it is advantageous to directly obtain an average amplitude and an average frequency of the ambient light radiation without requiring a complex signal processing operation using what is termed the host processor so as to increase the processing speed and to reduce the cost of the sensor ALS.

It should be noted that the conversion module 13 illustrated in FIG. 5 is, therefore, not essential for the sensor ALS.

Thus, the processing stage ET furthermore includes a processing module 10 configured to generate an intermediate signal SI through clipping CLIP and inversion INV of the preliminary counter output signal SSC, a sampling module 11 configured to undersample the intermediate signal SI at a sampling frequency FE lower than the clock frequency FH, a filtering module 12 configured to perform bandpass filtering of the sampled intermediate signal SIE so as to generate the digital AC signal SAN, and a measuring module 14 intended to receive the digital AC signal SAN and configured to measure the average amplitude SAM and the average frequency SFM of the digital AC signal SAN. The processing module 10, sampling module 11, and filtering module 12 may be implemented in any way known in the art. For example, some embodiments implement processing module 10, sampling module 11, and filtering module 12 using custom logic, a controller, a DSP, a processor, or any other suitable circuit. For example, filtering module 12 may be implemented using IIR or finite impulse response (FIR) filters. Other implementations are also possible.

It should be noted that the sampling of the intermediate signal SI at the known sampling frequency F2 advantageously enables subsequent digital filtering, in this case the bandpass filtering, while at the same time overcoming the variability of the trigger frequency of the preliminary counter 9, which frequency varies on the basis of the ambient light radiation received by the photodiodes PDR, PDG and PDB.

By way of indication, the second circuit 8 is implemented completely using digital technology so as advantageously to enable greater design flexibility and greater accuracy regarding the generation of the analog AC signal SAA.

Figure 6:
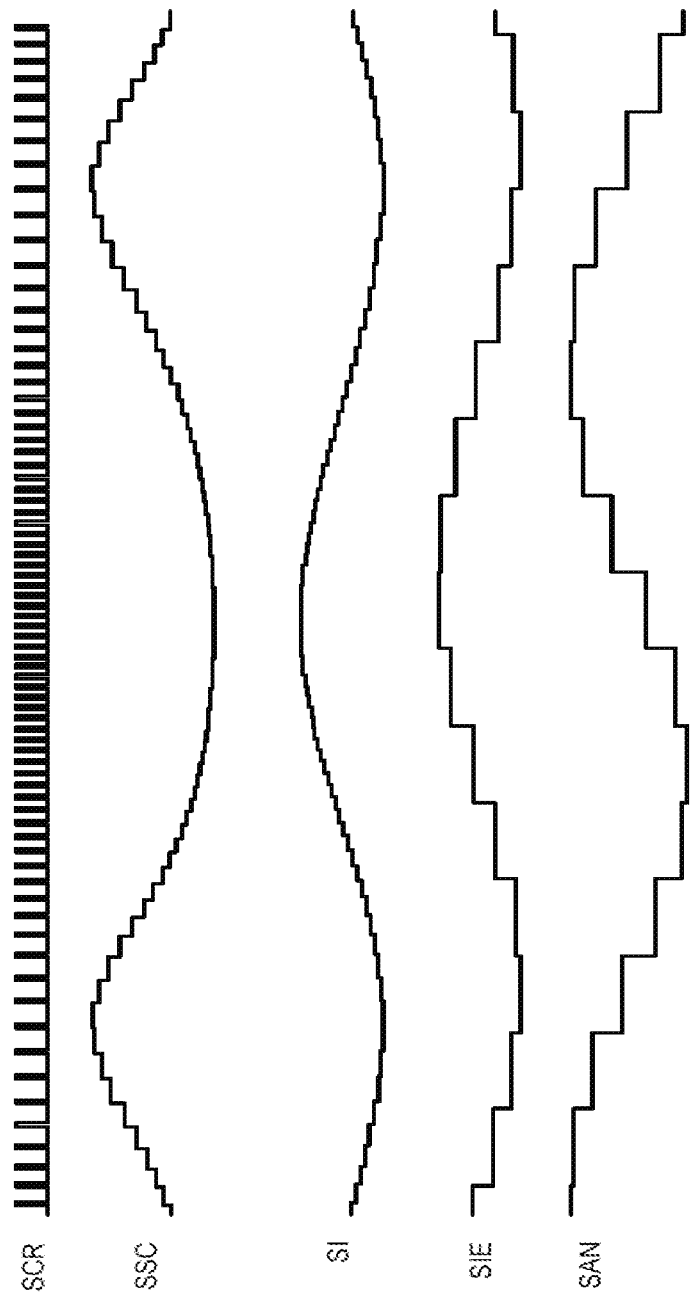

Reference is now made to FIG. 6 in order to show an example of a timing diagram illustrating the operation of the second circuit 8.

As described above, the comparison signal SCR is in the high state when the photodiode reaches its discharge threshold, in order words the voltage VK is lower than the reference voltage VREF.

The preliminary counter 9 is hence reset and triggered on the rising edges of the selected comparison signal, in this case for example the signal SCR.

The preliminary counter 9 is clocked by the clock signal CLK at a high frequency so as to effectively differentiate the varying discharge time Tdi on the basis of the light intensity received by the photodiode PDR.

When the received light intensity is low, the discharge time Tdi becomes longer, thereby enabling a longer period between two resets of the preliminary counter 9.

As a result, a low received light intensity results in an extended discharge time and in a higher value at the output of the preliminary counter 9.

After resetting, the preliminary counter 9 is incremented on each rising edge of the clock signal CLK. The greater the duration between two resets, the higher the value of the counter before the following reset.

The output signal SSC of the counter is formed by the values of the counter that are obtained before each reset of the preliminary counter 9. The lower the light intensity received by the photodiode PDR, the higher the value of the output signal SSC of the counter.

In order to eliminate excessively long discharge times Tdi, the processing module 10 is configured to perform clipping CLIP, in this case for example at 216, on the counter output signal SSC.

The processing module 10 is in addition configured to carry out an inversion INV of the counter output signal SSC following the clipping so as to generate an intermediate signal SI the amplitude of which is proportional to the light intensity received by the photodiode PDR, as illustrated in FIG. 6.

In order to balance the performance and the power consumption of the second circuit 8 while at the same time keeping the design flexibility, the sampling module 11 is configured to generate the sampled intermediate signal SIE by undersampling the intermediate signal SI at a sampling frequency FE lower than the clock frequency FH.

By way of non-limiting example, this sampling frequency FE may be 16 KHz and obtained from the clock signal CLK.

As is able to be seen in FIG. 6, the amplitude of the sampled intermediate signal SIE is proportional to the light intensity received by the photodiode PDR, just like the intermediate signal SI.

In practice, the flicker frequency of an artificial light source does not generally exceed 2 kHz. In order to further improve the performance and reduce the consumption of the sensor, the filtering module 12 is configured to carry out bandpass filtering on the sampled intermediate signal SIE.

By way of example, the bandpass filtering has a lower cutoff frequency of the order of 66 Hz and an upper cutoff frequency of the order of 2 kHz. The lower cutoff frequency is chosen to be at 66 Hz because the conventional frequencies of 50 Hz/60 Hz are taken into account in the control stage 6 for generating the DC signal SDC.

As illustrated in FIG. 5, the filtering module 12 may be formed by using a first low-pass filter FPB1 having a cutoff frequency at 2 kHz and coupled in series with a second low-pass filter FPB2 having a cutoff frequency at 66 Hz. The digital signal SN is obtained by subtracting the signal at the output of the first low-pass filter FPB1 and the signal at the output of the second low-pass filter FPB2.

The first and second low-pass filters FPB1 and FPB2 may for example be infinite impulse response (IIR) filters.

The digital AC signal SAN consequently has a bandwidth lower than 2 kHz. The dynamic range at 100 Hz is lower than 11 bits.

As illustrated in FIG. 5, the conversion module 13 may hence, for example, comprise a sigma-delta modulator MSD, known per se to those skilled in the art and configured to perform a first-order sigma-delta modulation having a dynamic range of 12 bits at 10 MHz; and a 1-bit digital-to-analog converter CNA, known per se and configured to perform a 1-bit digital-to-analog conversion and to generate the analog AC signal SAA.

Figure 7:
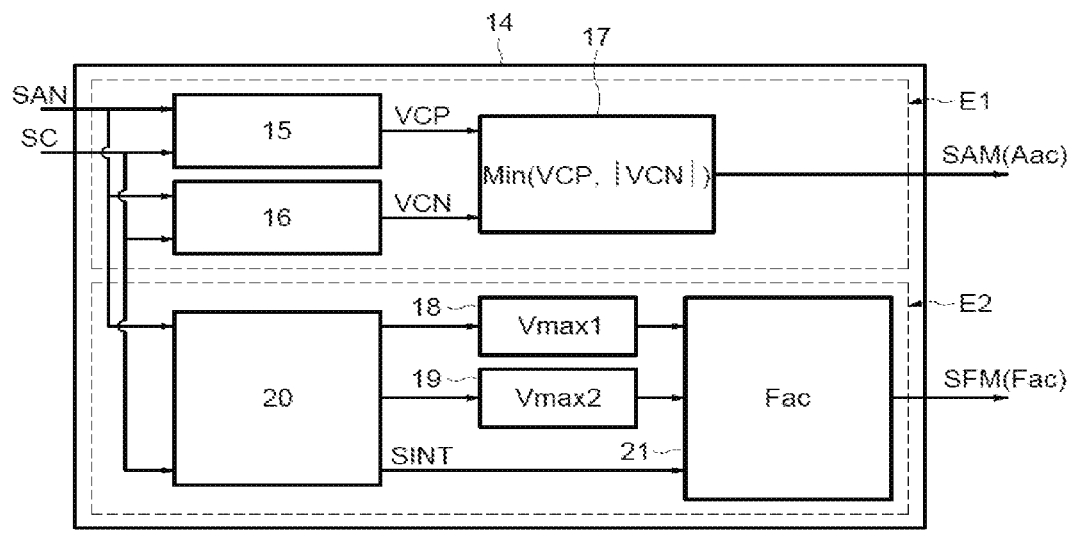

Reference is now made to FIG. 7 in order to schematically illustrate an exemplary implementation of the measuring module 14.

The measuring module 14 is intended to receive, as input, an AC signal, in this case, for example, the digital AC signal SAN and a control signal SC.

The control signal SC may, for example, be either an internal signal that is programmable and automatic, or manual via register writing by what is termed the host processor, or an external signal from the sensor ALS.

The control signal SC is intended to adjust a measuring period PM of the measuring module 14.

A measuring period PM begins when the control signal SC is in a first state, in this case, for example, its high state, and this measuring period PM is stopped when the control signal SC is in a second state, in this case, for example, its low state.

The measuring module 14 comprises a first stage E1 configured to generate an amplitude signal SAM the amplitude of which corresponds to the average amplitude Aac of the digital AC signal SAN in a measuring period PM and including a first measuring circuit 15, a second measuring circuit 16 and a comparison circuit 17, and a second stage E2 configured to generate an average frequency signal SFM the value of which corresponds to the average frequency Fac of the digital AC signal SAN during the measuring period PM and including a first counter 18, a second counter 19, control circuit 20 and calculating module 21. Control circuit 20 and calculating module 21 may be implemented with a controller, custom digital logic or with other digital or analog implementations, for example.

The first measuring circuit 15 is intended to receive the digital AC signal SAN and the control signal SC and configured to successively measure positive peak values VCP of the digital AC signal SAN when the control signal SC is in its high state.

The second measuring circuit 16 is also intended to receive the digital AC signal SAN and the control signal SC and configured to successively measure negative peak values VCN of the digital AC signal SAN when the control signal SC is in its high state.

The comparison circuit 17 is intended to receive the positive and negative peak values VCP and VCN and configured to successively compare the positive peak values VCP and the absolute values of the negative peak values |VCN| so as to generate the amplitude signal SAM the amplitude of which corresponds to the average amplitude Aac of the AC signal SAN.

The amplitude of the amplitude signal SAM corresponds to the minimum absolute values between the measured positive peak values VCP and the absolute values of the measured negative peak values |VCN|.

It is hence advantageously possible for the first stage E1 to follow the temporal evolution of the digital AC signal SAN while ignoring steep spikes and while keeping the values of the average amplitudes convergent and stable.

Figure 8:
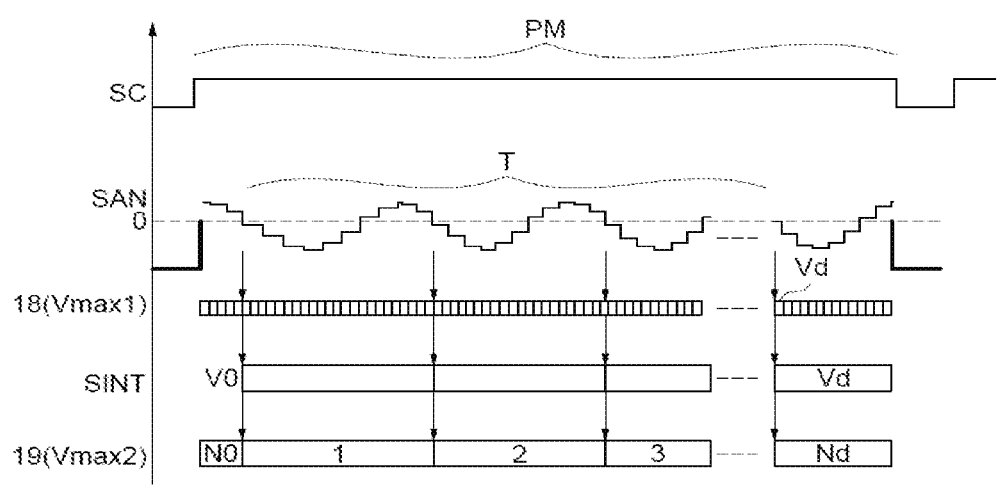
Figure 9:
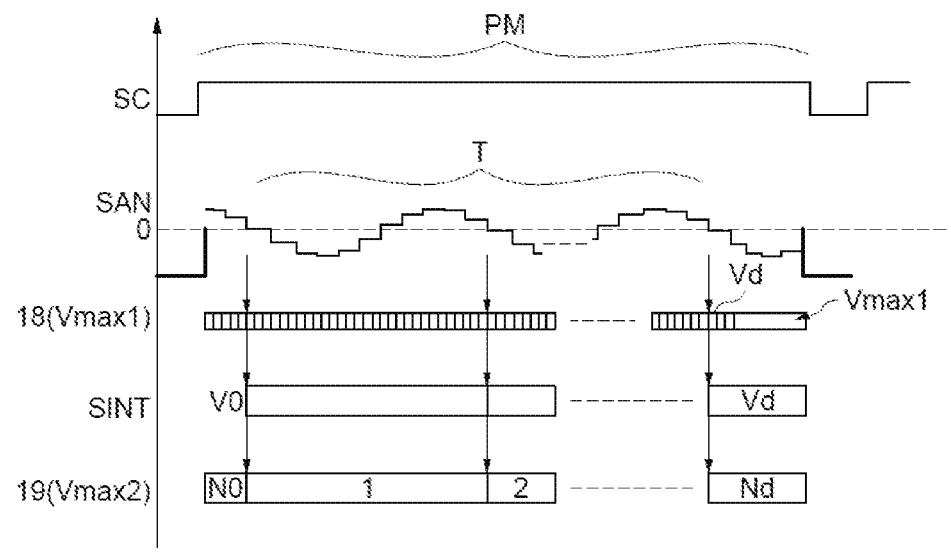
Figure 10:
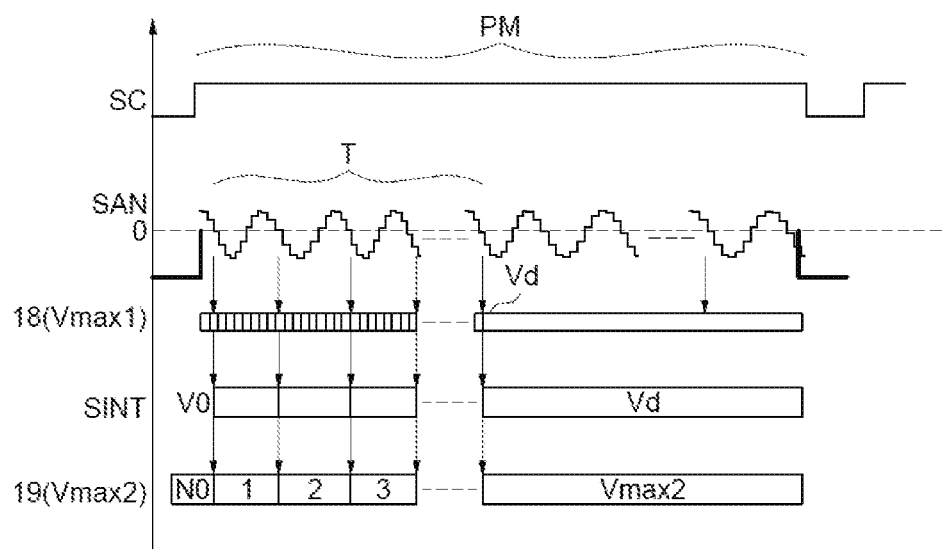

FIGS. 8 to 10 schematically illustrate examples of timing diagrams illustrating the operation of the second stage E2 of the measuring module 14.

Each time the control signal SC is in its high state, in other words at the beginning of each measuring period PM, the control circuit 20 of the second stage E2 is intended to receive the digital AC signal SAN and configured to trigger the first counter clocked at a first frequency F1, detect, from the beginning of the measuring period PM, each zero crossing of the AC signal SAN in a crossing direction, in this case for example corresponding to a zero crossing of the AC signal SAN from positive to negative values, record the current value of the first counter 18 at each zero crossing of the AC signal SAN in the crossing direction, trigger, at the first zero crossing of the AC signal SAN in the crossing direction, a second counter 19 with an initial counter value No, in this case for example at 0, and the second counter 19 is incremented at each subsequent zero crossing of the AC signal SAN in the crossing direction.

The first frequency F1 is higher than the maximum possible frequency of the digital AC signal SAN, namely 2 KHz after bandpass filtering.

By way of non-limiting example, the first frequency F1 may be 16 KHz. If this frequency F1 is increased, it is advantageously possible to increase the accuracy of the measurement of the average frequency Fac of the digital AC signal SAN, as the period of the interval between two successive updates of the first counter 18 is in fact used as a reference time unit for the measurement of the average frequency Fac of the digital AC signal SAN.

The first counter 18 also has a first maximum value Vmax1, in this case, for example, at 65535.

The value of the first counter 18 continues to increment at the same rate as the first frequency F1 until the end of the measuring period PM (FIG. 8) or until the instant when the current value of the first counter 18 reaches the first maximum value Vmax1 (FIG. 9).

The second counter 19 is in fact used as a counter of the number of periods of the digital AC signal SAN to be taken into account for the measurement of the average frequency.

The second counter 19 also has a second maximum value Vmax2, in this case, for example, at 255.

The value of the second counter 19 continues to increment each time the AC signal SAN crosses zero from its positive values until the instant when the value of the second counter 19 reaches the second maximum value Vmax2 (FIG. 10) or until the end of the measuring period PM (FIG. 8).

The control circuit 20 are furthermore configured to record the current value of the first counter 18 at each zero crossing of the AC signal SAN via an internal signal SINT.

More precisely, upon the first zero crossing of the digital AC signal SAN in the crossing direction, the control circuit 20 is configured to record the current value of the first counter 18 in the internal signal SINT and store this value in memory as an initial value Vo.

Next, at each subsequent zero crossing of the digital AC signal SAN in the crossing direction, the control circuit 20 is configured to update the internal signal SINT with the current value of the first counter 18.

When the control signal SC is in its low state, the calculating module 21 is intended to receive the last values of the first and second counters 18 and 19 and the first and last values of the internal signal SINT.

The calculating module 21 is configured to calculate the duration T of a portion of the AC signal SAN to be taken into account on the basis of the first frequency F1 and of the first and last stored current values of the first counter 18, that is to say the initial value Vo and the last value Vd of the internal signal SINT.

By way of non-limiting example, the control circuit 20 may be configured to set and trigger the first counter 18 at the first zero crossing of the digital AC signal SAN in the crossing direction so as to eliminate the need to subtract the initial value Vo thereafter.

The period of the interval between two successive updates of the first counter 18 may be calculated as follows: T1=1/F1=1/16K. It is possible to obtain the number of periods of the AC signal SAN to be taken into account for the measurement of the average frequency by subtracting the initial value Vo from the last value Vd of the internal signal SINT. T=(Vd−Vo)*T1 is thus obtained.

The calculating module 21 is furthermore configured to calculate the average frequency Fac of the AC signal SAN on the basis of the duration T, the initial counter value No and the last value Nd of the second counter 19, namely Fac=(Nd−No)/T.

In the example illustrated in FIG. 8, when the control signal SC changes to its low state, the current values of the first and second counters 18 and 19 do not yet reach the first and second maximum values Vmax1 and Vmax2, respectively.

In this case, the values to be taken into account for the measurement of the average frequency are therefore the last values Vd and Nd of the internal signal SINT and of the second counter 19 before the control signal SC is in its low state.

With regard to the example illustrated in FIG. 9, the value of the first counter 18 reaches the first maximum value Vmax1 earliest, before the control signal SC is in the low state. The control circuit 20 is configured to stop the subsequent updates of the internal signal SINT and of the second counter 19.

It should be noted that if the first counter 18 does not reach the first maximum value Vmax1 at the instant of a zero crossing of the AC signal SAN in the crossing direction, the internal signal SINT keeps its last value Vd, that is to say the value that it had at the last zero crossing, in the crossing direction, of the signal SAN.

In this circumstance, the values to be taken into account for the measurement of the average frequency are therefore the last value of the internal signal SINT minus the initial value Vo and the last corresponding value Nd of the second counter 19.

It should be noted that the example illustrated in FIG. 9 corresponds to a case in which the average frequency Fac to be measured is excessively low.

In the example illustrated in FIG. 10, the value of the second counter 19 reaches the second maximum value Vmax2 before the control signal SC is in the low state. The control circuit 20 is configured to stop the subsequent updates of the internal signal SINT and of the first counter 18.

In this example, the values to be taken into account for the measurement of the average frequency are therefore the value of the first counter 18 corresponding to the instant when the value of the second counter 19 reaches the second maximum value Vmax2, and the second maximum value Vmax2.

It should be noted that the example illustrated in FIG. 10 corresponds to a case in which the average frequency Fac to be measured is excessively high.

The calculating module 14 is furthermore configured to generate the average frequency signal SFM the value of which corresponds to the average frequency Fac of the digital AC signal SAN.

As the internal signal SINT and the value of the second counter 19 are both updated at the instant when the digital AC signal SAN crosses zero from its positive values, the measurement of the average frequency Fac is always correct, even if the control signal SC does not change to its low state at the instant of a zero crossing of the digital AC signal SAN.

It should be noted that when the measuring module 14 is also able to receive an analog AC signal and to measure the average amplitude and the average frequency of this analog AC signal.

The average amplitude and the average frequency of the AC signal, representative of the flicker level and the flicker frequency or frequencies of the artificial light sources in the proximity of the ambient light sensor, are thus obtained easily and quickly.

By way of non-limiting indication, the amplitude signal SAM and the average frequency signal SFM may be delivered to a computer bus commonly known under the acronym I²C ("Inter-Integrated Circuit") and/or to what is termed the host processor for subsequent processing operations so as to improve the performance of the camera module CAM.

What is claimed is:

1. A method for measuring an average frequency of an AC signal, the method comprising:
    receiving the AC signal during a measuring period that has a beginning and an end;
    triggering a first counter that is clocked at a first frequency higher than a maximum frequency of the AC signal;
    detecting each zero crossing of the AC signal in a predetermined crossing direction starting from the beginning of the measuring period;
    recording a value of the first counter at each detected zero crossing;
    triggering a second counter with an initial counter value at a first zero crossing of the AC signal in the predetermined crossing direction;
    incrementing the second counter at each subsequent zero crossing of the AC signal in the predetermined crossing direction;
    calculating a duration of a portion of the AC signal based on the first frequency and on a first and last recorded values of the first counter; and
    calculating the average frequency of the AC signal based on the duration, the initial counter value and a last value of the second counter.

2. The method of claim 1, wherein the first counter has a first maximum value and the second counter has a second maximum value, the method further comprising:
    stop incrementing the second counter when the value of the first counter reaches the first maximum value; and
    stop recording the value of the first counter when a value of the second counter reaches the second maximum value.

3. The method of claim 1, wherein the predetermined crossing direction corresponds to a zero crossing of the AC signal from a positive value to a negative value.

4. The method of claim 1, further comprising, during the measuring period:
    successively measuring positive peak values of the AC signal;
    successively measuring negative peak values of the AC signal;
    successively comparing the measured positive peak values and absolute values of the measured negative peak values; and
    generating an amplitude signal having an amplitude that corresponds to an average amplitude of the AC signal.

5. The method of claim 4, wherein the amplitude of the amplitude signal corresponds to minimum values between the measured positive peak values and the absolute values of the measured negative peak values.

6. The method of claim 1, wherein the measuring period is adjustable.

7. The method of claim 1, wherein the AC signal is a digital AC signal representative of a level of ambient light radiation.

8. The method of claim 7, further comprising:
    clocking a third counter with a clock signal having a second frequency;
    resetting and triggering the third counter each time at least one photodiode illuminated by the ambient light radiation reaches a discharge threshold;
    delivering a third counter output signal;
    generating an intermediate signal by clipping and inverting the third counter output signal;
    undersampling the intermediate signal at a third frequency lower than the second frequency; and
    bandpass-filtering the undersampled intermediate signal so as to generate the AC signal, wherein the bandpass-filtering comprises an upper cutoff frequency that determines the maximum frequency of the AC signal.

9. An electronic circuit comprising:
    a first counter configured to be clocked at a first frequency;
    a second counter;

a first control circuit configured to receive, during a measuring period, an AC signal having a maximum frequency that is lower than the first frequency, wherein the first control circuit is configured to:
trigger the first counter,
detect, starting from a beginning of the measuring period, each zero crossing of the AC signal in a predetermined crossing direction,
record a current value of the first counter at each zero crossing of the AC signal in the predetermined crossing direction,
trigger, at a first zero crossing of the AC signal in the predetermined crossing direction, the second counter with an initial counter value, and
increment the second counter at each subsequent zero crossing of the AC signal in the predetermined crossing direction; and
a module configured to:
calculate, at an end of the measuring period, a duration of a portion of the AC signal based on the first frequency and of a first and a last recorded current values of the first counter, and
calculate an average frequency of the AC signal based on the duration, the initial counter value and a last value of the second counter.

10. The electronic circuit of claim 9, wherein:
the first counter has a first maximum value;
the second counter has a second maximum value; and
the first control circuit is configured to stop incrementing the second counter when the current value of the first counter reaches the first maximum value, and stop recording the current value of the first counter when the value of the second counter reaches the second maximum value.

11. The electronic circuit of claim 9, wherein the predetermined crossing direction corresponds to a zero crossing of the AC signal from a positive value to a negative value.

12. The electronic circuit of claim 9, further comprising:
a first measuring circuit configured to successively measure positive peak values of the AC signal;
a second measuring circuit configured to successively measure negative peak values of the AC signal; and
a comparison circuit configured to successively compare the measured positive peak values with absolute values of the measured negative peak values, and deliver an amplitude signal having an amplitude that corresponds to an average amplitude of the AC signal.

13. The electronic circuit of claim 12, wherein the amplitude of the amplitude signal corresponds to minimum values between the measured positive peak values and the absolute values of the measured negative peak values.

14. The electronic circuit of claim 9, wherein the measuring period is adjustable.

15. The electronic circuit of claim 9, wherein the AC signal is a digital AC signal representative of a level of ambient light radiation.

16. The electronic circuit of claim 15, further comprising:
a photodiode;
a third counter configured to be clocked by a clock signal having a second frequency so as to deliver a third counter output signal;
a control module configured to reset and trigger the third counter when the photodiode illuminated by ambient light radiation reaches a discharge threshold; and
a second control circuit comprising:

a processing module configured to generate an intermediate signal through clipping and inversion of an output signal of the third counter,
a sampling module configured to undersample the intermediate signal at a third frequency lower than the second frequency, and
a filtering module configured to perform bandpass filtering of the undersampled intermediate signal so as to generate the AC signal, the bandpass filtering having an upper cutoff frequency that determines the maximum frequency of the AC signal.

17. The electronic circuit of claim 15, further comprising an ambient light sensor configured to generate the AC signal based on the level of ambient light radiation.

18. A system comprising:
a photodiode coupled between a first supply terminal and a first node;
a first switch coupled between the first node and a second supply terminal;
a control module comprising a first comparator having an input coupled to the first node; and
a second circuit comprising a preliminary counter having an input coupled to an output of the first comparator, and a measuring module having an input coupled to an output of the preliminary counter, the measuring module configured to generated an average frequency signal based on the output of the preliminary counter.

19. The system of claim 18, wherein the control module further comprises a control stage configured to generate a value representative of an intensity of light based on an output of the first comparator.

20. The system of claim 18, wherein the second circuit further comprises:
a processing module coupled between the preliminary counter and the measuring module, the processing module configured to generate an intermediate signal;
a sampling module configured to undersample the intermediate signal and generate an undersampled intermediate signal; and
a filtering module configured to filter the undersampled intermediate signal and generate a digital AC signal, wherein the average frequency signal is an average frequency of the digital AC signal.

21. The system of claim 20, wherein the measuring module comprises:
a first counter configured to be clocked at a first frequency;
a second counter;
a control circuit configured to:
receive the digital AC signal,
record a value of the first counter at each zero crossing of the digital AC signal during a measuring period, and
increment the second counter at each zero crossing of the digital AC signal during the measuring period; and
a controller configured to calculate the average frequency of the digital AC signal based on the first frequency, a last recorded value of the first counter, and a last value of the second counter.

22. The system of claim 20, wherein the system is a cellular mobile telephone, tablet, laptop computer, or a motor vehicle.

23. The system of claim 20, wherein each zero crossing of the digital AC signal comprises each time the digital AC signal transitions from a value higher than a predetermined threshold to a value lower than the predetermined threshold.

* * * * *